United States Patent [19]
Kazle

[11] Patent Number: 5,936,847
[45] Date of Patent: Aug. 10, 1999

[54] LOW PROFILE ELECTRONIC CIRCUIT MODULES

[75] Inventor: Scott J. Kazle, Mound, Minn.

[73] Assignee: HEI, Inc., Victoria, Minn.

[21] Appl. No.: 08/642,114

[22] Filed: May 2, 1996

[51] Int. Cl.⁶ ...................................... H05K 1/11
[52] U.S. Cl. .................. 361/771; 174/259; 174/260; 174/261; 361/767; 361/770
[58] Field of Search ..................... 174/259, 260, 174/261, 262, 263, 264, 265, 266; 228/180.21, 180.22; 257/700, 701, 723, 725, 738, 772, 773, 774, 778, 779, 780, 786; 361/760, 767, 768, 769, 770, 771, 779, 782, 783, 820; 439/68, 82, 71, 83; 438/108, 117, 118, 119

[56] References Cited

U.S. PATENT DOCUMENTS

| | | | |
|---|---|---|---|
| 5,189,505 | 2/1993 | Bartelink | 257/419 |
| 5,196,371 | 3/1993 | Kulesza et al. | 437/183 |
| 5,237,130 | 8/1993 | Kulesza et al. | 174/260 |
| 5,406,459 | 4/1995 | Tsukamoto et al. | 361/797 |
| 5,407,864 | 4/1995 | Kim | 257/698 |
| 5,534,442 | 7/1996 | Parker te al. | |

FOREIGN PATENT DOCUMENTS 0 520 434 A1  12/1992  European Pat. Off. .

Primary Examiner—Donald Sparks
Attorney, Agent, or Firm—Schwegman, Lundberg, Woessner & Kluth, P.A.

[57] ABSTRACT

An improved circuit module construction for mounting and interconnecting electronic components to substrates, which is applicable to mounting a wide variety of electronic components and conductors, including inverted or 'flip chip' mounted integrated circuits. The components are mounted to the substrate with a sandwiched non-conductive polymer layer which acts as the bonding agent and underfill. The substrate and underfill have apertures aligned with signal traces on the substrate and the contacts of the component and conductive polymer is injected through the apertures to fill the area between the substrate contacts and the component contacts, to secure good electrical connection. In one embodiment the non-conductive polymer is printed on the contact side of the substrate with gaps for the contacts. In another embodiment B-staged non-conductive polymer is coated on the non-contact side of the substrate, prior to forming contact apertures and mounting of components. Conductive polymer is then injected in the apertures to make the electrical connections, and the assembly is cured. No coating or pre-treatment of the components is needed.

1 Claim, 2 Drawing Sheets

LOW PROFILE ELECTRONIC CIRCUIT MODULES

FIELD OF THE INVENTION

This invention pertains generally to the field of electronic assembly, and specifically to an improved circuit construction and method for mounting and interconnection of electronic components including inverted or 'flip chip' mounted integrated circuits to substrates.

BACKGROUND OF THE PRIOR ART

With continuing progress in miniaturization in electronic components and devices comes new challenges and opportunities in assembly and packaging of electronic modules and devices. For many applications integrated circuit (IC) dies are surface-mounted to the circuit board, flex circuit or other substrate (referred to collectively as "substrate(s)" herein) where they will be used, instead of first packaging the dies in chip carriers. This permits more dense packaging where physical size and short signal paths are a concern.

The industry standard for electrical connections to an IC die is a number of connection pads which can be wire-bonded, on a surface (often referred to as the "top" surface, regardless of the orientation in which the chip will be mounted) of the chip. However, some common types of mounting of ICs require special preparations for the bond sites prior to mounting. One such method, referred to as "flip chip" mounting, involves surface mounting the ICs inverted so that their tops are on the substrate with their bond pads for signal and power connections facing or contacting the substrate. A common technique is to prepare the bond pads on the IC with solder bumps or gold bumps, which then contact corresponding signal or power traces or pads on the substrate. Soldering the bumps to the substrate provides electrical and mechanical connection for the IC.

More recently, various types of conductive polymers have been used instead of solder or gold for making these connections. In such systems the polymer is applied to the IC bond pads, the substrate traces, or both, and serves to bond and make electrical connections between the IC and substrate when the IC is placed on the substrate. Some polymer methods do not require special treatment of the bond pads of the IC, which is an advantage.

It has been generally recognized that for mechanical security and resistance to mechanical and thermal stress, and IC mounted to a substrate by one of the above techniques needs to be underfilled to fill the void which would otherwise be left between the surface of the IC and the substrate supported by the bonding of the bond pads. Various methods have been proposed to use a combination of conductive and non-conductive polymers. The conductive polymer is used for the electrical connections to the IC, while the non-conductive polymer is used as the attachment and underfill for the IC. Such techniques involve the application by printing steps of patterns of conductive and non-conductive polymers (or monomers which are subsequently polymerized) on the IC and/or the substrate, according to the specific locations of the ICs and the electrical contact traces. However, it can be difficult in such systems to achieve the necessary precision in registration. Other methods in have been developed for forming the underfill from an epoxy or some other non-conductive polymer. One technique is to apply the underfill in liquid form to the substrate in a dispensing step after mounting the ICs. However, mounting the IC first then underfilling using the capillary action of a non-conductive polymer is a relatively slow process. Another technique is to provide a hole in the substrate under the IC through which liquid epoxy is dispensed to form the underfill. Others have proposed using a vacuum technique for applying the underfill.

Although the above-described techniques provide useful alternatives for mounting of ICs, the present invention provides further improvements in terms of simplicity and efficiency of process, and integrity of the mechanical and electrical connections of components to the substrate.

SUMMARY OF THE INVENTION

Accordingly, the present invention provides improved circuit module constructions for mounting and interconnecting electronic components to substrates, which are applicable to mounting a wide variety of electronic components and conductors. The components are mounted to the substrate with a sandwiched non-conductive polymer layer which has clearance apertures for the corresponding contacts of the substrate and the components, and which serves as an underfill for the components. The substrate has apertures through its contact areas aligned with the contacts of the components. Conductive polymer is injected through the apertures to fill the area between the substrate contacts and the component contacts, to provide the electrical connection therebetween.

In one embodiment the non-conductive polymer is printed on the contact side of the substrate with gaps for the contacts. In another embodiment B-staged non-conductive polymer is coated on the non-contact side of the substrate, prior to forming contact apertures and mounting of components.

The present invention provides secure and efficient mechanical and electrical connection to the components, without requiring pre-processed or non-standard components.

These and other features and advantages of the invention will become apparent from the following description of the preferred embodiment of the invention.

DESCRIPTION OF THE PREFERRED EMBODIMENT

Figure 1:
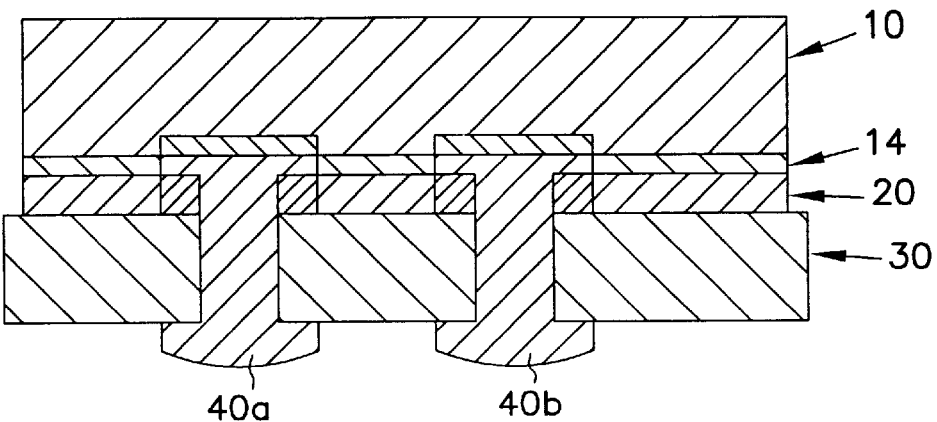
FIG. 1 is a diagrammatic view in cross section of a portion of an electronic assembly or module according to a first embodiment of the present invention.
Figure 2:
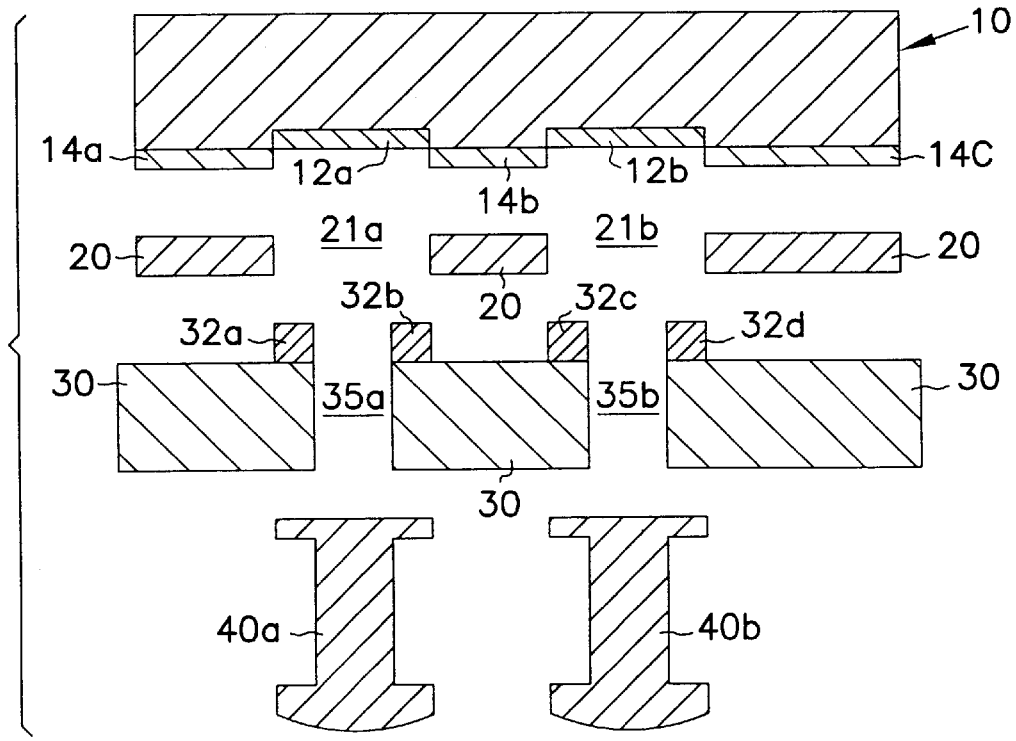
FIG. 2 is a view similar to FIG. 1, with the various layers exploded for purposes of illustration.

A first preferred embodiment of the invention is illustrated in FIGS. 1 and 2 in the mounting of an IC 10 to a substrate 30. The IC 10 has a plurality of bond pads for connections of signals and power to and from the IC as is generally known. FIGS. 1 and 2 are at an enlarged scale such that only a fragment of an IC and two bond pads 12a and 12b are shown. It will be appreciated that any number of bond pads may be accommodated, according to the type of IC and its function. The surface area of IC 10 between bond pads is covered by a passivation layer, as is generally known in the field of IC fabrication, and this passivation layer is indicated by segments 14a, 14b, 14c in the Figures.

One feature of the present invention is that it is applicable to the mounting of a wide variety of components, so the reference to ICs in the preferred embodiment is by way of example only, and not by way of limitation. Other examples would include resistors, capacitors, thermistors, diodes, jumpers, and any other type of component which is to be electrically and mechanically attached to a substrate.

Substrate 30 may be any type of mounting, flex circuit, circuit board, or circuit carrier, including common examples i.e. made of ceramics or polyester. The substrate may be single or multilayer, as is generally known in the art, in order to provide the appropriate interconnects and signal traces according to the function and design purpose for the assembly. Substrate 30 includes a plurality of signal traces for delivering signals and power to and from the various bond pads, and some of these are indicated in section by reference numbers 32a, 32b, 32c, 32d in the Figures. Traces 32a, 32b correspond to bond pad 12a, and traces 32c, 32d correspond to bond pad 12b.

Substrate 30 has a plurality of holes or apertures, of which two are shown, indicated by reference numbers 35a and 35b. These holes are aligned with signal traces, which form surrounds completely or partially surrounding the apertures, for making electrical contact therewith when subsequently filled with conductive polymer. The surrounds and apertures correspond to the location bond pads of the IC when mounted. These apertures may be formed by any number of techniques, for example drilling or laser burning, either before or after the ICs are mounted. In the preferred form, signal traces such as 32a and 32b, are surrounds for the apertures, i.e, they are fabricated as sides of a larger ring, rectangle or other shape, around the location for aperture 35a and bond pad 12a, and only appear as separate elements in this sectional view. Alternatively, traces 32a and may be fabricated as separate elements in the location for aperture 35a and bond pad 12a. The apertures 35 may be formed at any time before, during or after the fabrication of the substrate, but the preferred way is to form the apertures by drilling, laser burning or cutting through the substrate and traces to leave a surround of ring or other-shaped pad surrounding the aperture.

Underfill for mechanical support and bonding of IC 10 to substrate 30 is provided by underfill layer 20. This is formed of a non-conductive polymer which is printed or otherwise coated over the surface of substrate 30, IC 10, or both. The thickness and location of this non-conductive polymer is controlled so as to cover all or substantial portions of the various non-bond pad areas 14 of IC 10, while avoiding the various bond pads 12. The traces 32 can be seen to form dams dividing this material out from the areas of the bond pads. This results in gaps 21a, 21b, in the nonconductive polymer layer 20 aligned with the bond pads 12a, 12b, and the apertures 35a, 35b.

Mounting of IC 10 to substrate 30 sandwiches non-conductive polymer layer 20 between IC 10 and substrate 30, to form the underfill. Layer 20 also may serve as the adhesive to hold IC 10 in place.

Conductive polymer material, indicated by reference numbers 40a, 40b is then injected in apertures 35a, 35b to make the electrical connection. As seen in FIG. 1, the conductive polymer fills from apertures 35a, 35b, through gaps 21a, 21b, and into the space between and in contact with, the signal traces 32a, 32b and bond pad 21a, and likewise for all other bond pads and their associated traces. This makes the necessary electrical communication between the IC and substrate without the need for solder or gold bumps, nor any subsequent soldering operation. The non-conductive polymer layer 20, along with the signal trace surrounds 32a,b and 32c,d may help to confine the conductive polymer to the desired locations to maintain insulation of the signals, and to prevent it from contacting and shorting to other pads.

Application of conductive polymer in locations 40a,b may be done by automated techniques from the bottom of the substrate, after the ICs or other components are mounted.

Figure 3:
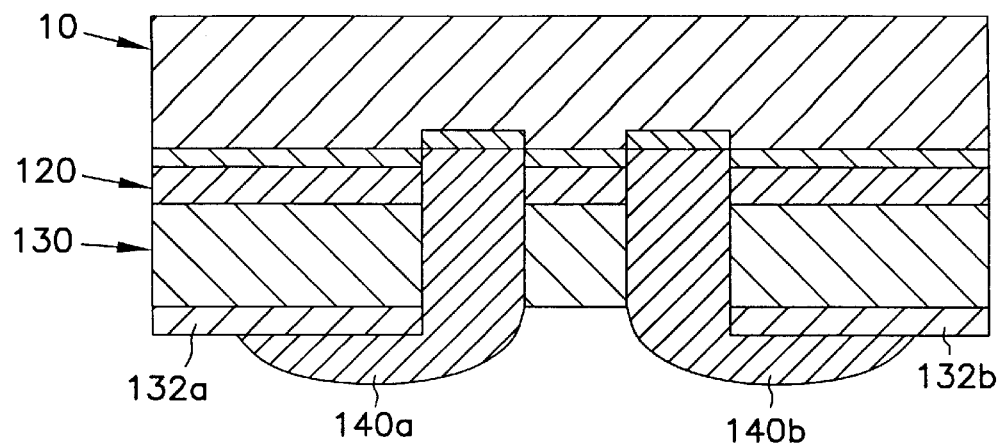
FIG. 3 is a diagrammatic view in cross section of a portion of an electronic assembly or module according to a second embodiment of the present invention.
Figure 4:
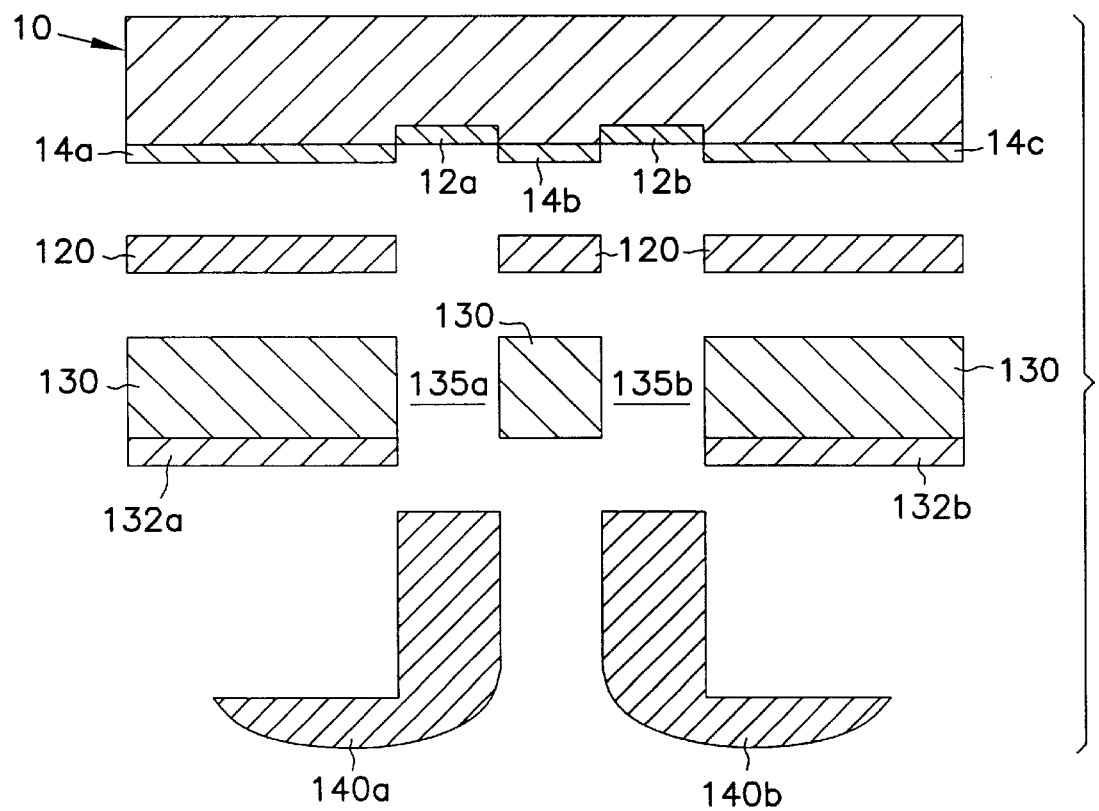
FIG. 4 is a view similar to FIG. 3, with the various layers exploded for purposes of illustration.

Another preferred embodiment of the invention is illustrated in FIGS. 3 and 4, which also shows the mounting of an IC 10 to a substrate 30, it being understood that the technique is applicable to other types of components as well. The IC 10 is a standard type of IC as previously generally described with reference to FIGS. 1 and 2.

The substrate 130 use in the embodiment of FIGS. 3 and 4 is slightly different from the one in the previous embodiment, in that it preferably has signal traces 132a, 132b for connection to the bond pads of the IC on the "bottom" of the substrate, that is, on the side away from the IC rather than the side adjacent the IC as in the embodiment of FIGS. 1 and 2. The reason for this will be apparent from the following description of manner in which the connections are made.

A layer of non-conductive polymer 120 is formed on the surface of substrate 130. This may be a modified epoxy resin or other type of non-conductive polymer as is generally known. This material is in B-staged, partially cured, form. This can be accomplished by coating with the material having been perviously B-staged to a sticky film. Alternatively, the material can be applied in liquid form and baked to B-staged form. Note that because the signal traces 132a,b are on the other side, layer 120 may be a uniform layer, which avoids the complications of registering the printing of a pattern to coincide with features on the substrate. Layer 120 will form the underfill for the ICs or other components to be mounted.

After coating, holes are formed through the substrate 130 and its B-staged polymer coating 120 at locations corresponding to where traces will be connected to the bond pads 12a,b of the IC. Two such holes are indicated in FIGS. 3 and 4 by reference numbers 135a and 135b. These holes may be formed by any method, such as by punching, drilling or laser cutting.

Subsequently, the ICs may be mounted to the top of the substrate, with their bond pads 12a,b aligned with the holes 135a and 135b. Preferably, the B-staged polymer layer 120 is sticky enough to hold the ICs in place at this stage. Then, the conductive polymer is applied from the bottom to the holes 135a, 135b as indicated at 140a, 140b. The conductive polymer may be, for example, a silver filled modified epoxy resin, or other types of conductive material. The application of the conductive material may be done by automated techniques from the bottom of the substrate. For example, if the substrate 130 is very thin, a stencil or screen printing step, or a bladder inject step can be used to apply the conductive polymer, and will inherently inject the conductive material into the holes 135a, 135b. If the substrate 130 is somewhat thicker, then a separate dispensing step is preferred for injecting the conductive polymer into holes 135a, 135b.

The conductive polymer at locations 140a, 140b provides the electrical connection between the signal traces 132a, 132b and the bond pads 12a, 12b. The assembly may then be cured, which cures both the B-staged non-conductive polymer and the conductive polymer, to finish the process.

The present invention provides numerous advantages as compared with older module construction techniques. A major advantage is that no special steps of pre-treatment of the ICs or other components is needed. Specifically, there is no need for application of solder or gold bumps, or special mounting posts. The relatively slow process of capillary action underfilling of the prior art is avoided. The locations of the conductive and non-conductive polymers in this invention serves to guard against unintended bridging or short circuits, thus improving yields. The entire process is thus simplified and made more efficient. Any efficiency increases are important and of significant financial impact, in the case of high volume, low cost devices.

It will be seen from the above that the present invention provides an improved circuit construction and method for mounting and interconnection of electronic components to substrates. While the preferred embodiments of the invention have been described, it will be appreciated that the invention is not limited to the specific applications described for illustrative purposes, and that many variations of configurations, applications, components and materials are possible, within the scope of the invention.

I claim:

1. An electronic circuit module, comprising a substrate, having apertures therethrough, and having electrical contact areas on a mounting surface thereof as surrounds for the apertures wherein the electrical contact surrounds have a thickness above the adjacent surface of the substrate;

one or more electronic components for mounting on the substrate, the components having bond pads thereon for positioning in alignment with the electrical contact surrounds on the substrate wherein the components are mounted on the same side of the substrate as the electrical contact surrounds;

a non-conductive polymer layer positioned between the component and the substrate, and forming an underfill for the component, the layer having gaps therein aligned with the electrical contact surrounds and bond pads wherein the non-conductive polymer layer has a corresponding or slightly greater thickness than the thickness of the electrical contact surrounds; and conductive polymer material positioned within the apertures, the gaps and in contact with the electric contact surrounds and the bond pads, for making electrical contact therebetween wherein the surrounds and layer form barriers to prevent bridging of the conductive polymer.

* * * * *